United States Patent
Li et al.

(10) Patent No.: US 11,375,604 B2
(45) Date of Patent: Jun. 28, 2022

(54) CAMERA MODULE CAPABLE OF DISSIPATING HEAT AND ELECTRONIC DEVICE USING THE SAME

(71) Applicant: TRIPLE WIN TECHNOLOGY(SHENZHEN) CO. LTD., Shenzhen (CN)

(72) Inventors: Kun Li, Guangdong (CN); Shin-Wen Chen, New Taipei (TW); Long-Fei Zhang, Guangdong (CN); Xiao-Mei Ma, Guangdong (CN)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 361 days.

(21) Appl. No.: 16/727,740

(22) Filed: Dec. 26, 2019

(65) Prior Publication Data
US 2021/0127477 A1   Apr. 29, 2021

(30) Foreign Application Priority Data
Oct. 28, 2019   (CN) .......................... 201911033357.9

(51) Int. Cl.
*H04N 5/225* (2006.01)
*H05K 1/02* (2006.01)
*G02B 7/04* (2021.01)
*G02B 7/02* (2021.01)
*H05K 1/18* (2006.01)
*G02B 5/20* (2006.01)
*H01L 35/32* (2006.01)

(52) U.S. Cl.
CPC .......... *H05K 1/0203* (2013.01); *G02B 7/022* (2013.01); *G02B 7/04* (2013.01); *H04N 5/2253* (2013.01); *H04N 5/2254* (2013.01); *H05K 1/028* (2013.01); *H05K 1/181* (2013.01); *G02B 5/20* (2013.01); *H01L 35/32* (2013.01); *H05K 2201/066* (2013.01); *H05K 2201/09036* (2013.01); *H05K 2201/10121* (2013.01); *H05K 2201/10151* (2013.01); *H05K 2201/10219* (2013.01)

(58) Field of Classification Search
CPC .................................................... H04N 5/2253
USPC ........................................................ 348/335
See application file for complete search history.

(56) References Cited

U.S. PATENT DOCUMENTS

| | | | | |
|---|---|---|---|---|
| 2004/0075870 A1* | 4/2004 | Karaki | ................... | H04N 5/349 358/296 |
| 2012/0276951 A1* | 11/2012 | Webster | ............... | H04N 5/2257 348/374 |

FOREIGN PATENT DOCUMENTS

| | | | | |
|---|---|---|---|---|
| EP | 2734018 A1 * | 5/2014 | .......... | H01J 49/0004 |
| TW | M469509 U | 1/2014 | | |

(Continued)

*Primary Examiner* — Joel W Fosselman
(74) *Attorney, Agent, or Firm* — ScienBiziP, P.C.

(57) ABSTRACT

A camera module includes a printed circuit board, a sensor, and a refrigeration chip. A first receiving groove is defined in the printed circuit board. The sensor is received in the first receiving groove and electrically connected to the printed circuit board. The refrigeration chip is formed on and electrically connected to the printed circuit board. The refrigeration chip comprises a cold surface. The sensor is formed on the cold surface. The cold surface is configured to absorb heat from the sensor when the refrigeration chip is powered on. The camera module is capable of dissipating heat and controlling an internal temperature of the camera module.

16 Claims, 4 Drawing Sheets

(56) References Cited

FOREIGN PATENT DOCUMENTS

TW    201902202 A    1/2019
WO    2019091133 A1  5/2019

* cited by examiner

CAMERA MODULE CAPABLE OF DISSIPATING HEAT AND ELECTRONIC DEVICE USING THE SAME

FIELD

The subject matter of the application generally relates to a camera module.

BACKGROUND

Electronic devices, such as mobile phones, tablet computers, or cameras, may have camera modules. The camera modules have a lens, an image-focus motor, a filter, a sensor chip, a plastic holder, and a circuit board. The plastic holder is mounted to the circuit board by optical adhesives. The optical adhesives are then heated, thus at least one escape hole or escape groove is necessary in the plastic holder for dissipating gases and heat. After heating, the at least one escape hole or escape groove is sealed by dispensing optical adhesives therein, thereby preventing debris from entering the camera modules and affecting image quality. However, during working, a large amount of heat may also be generated inside the camera modules. Since the at least one escape hole or escape groove has been sealed, the heat cannot be dissipated outside the camera modules, which will affect the image quality.

Therefore, there is room for improvement in the art.

BRIEF DESCRIPTION OF THE DRAWINGS

Implementations of the present disclosure will now be described, by way of embodiments, with reference to the attached figures.

DETAILED DESCRIPTION

Figure 1:
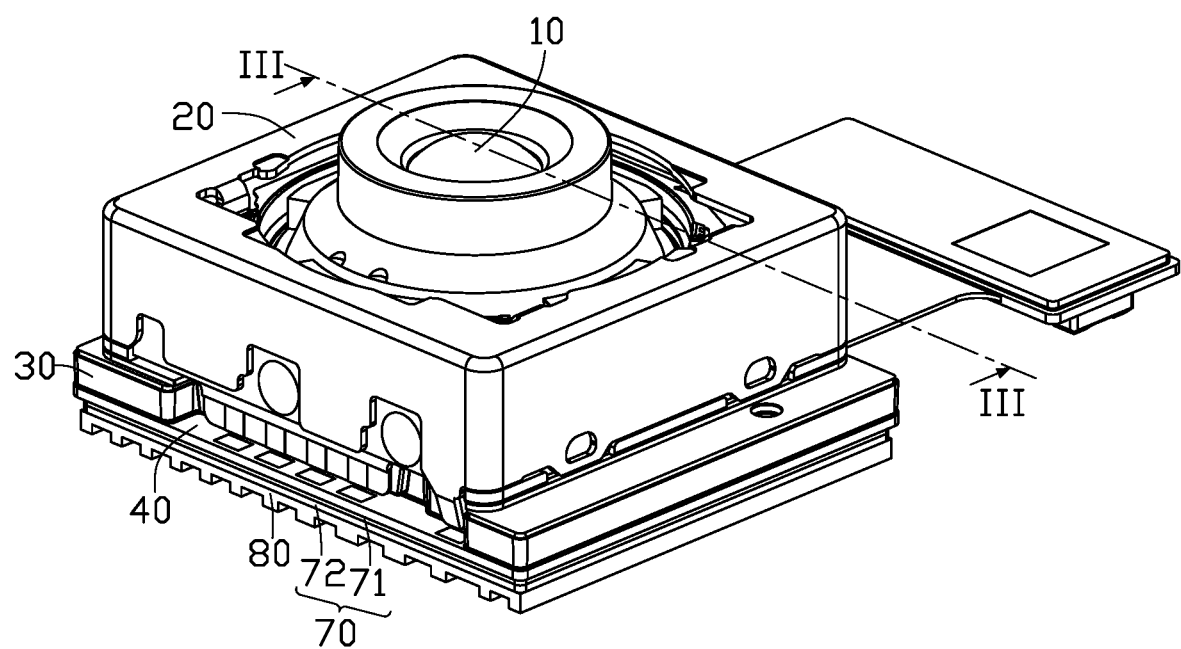
FIG. 1 is a perspective view of a camera module according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain portions may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Figure 2:
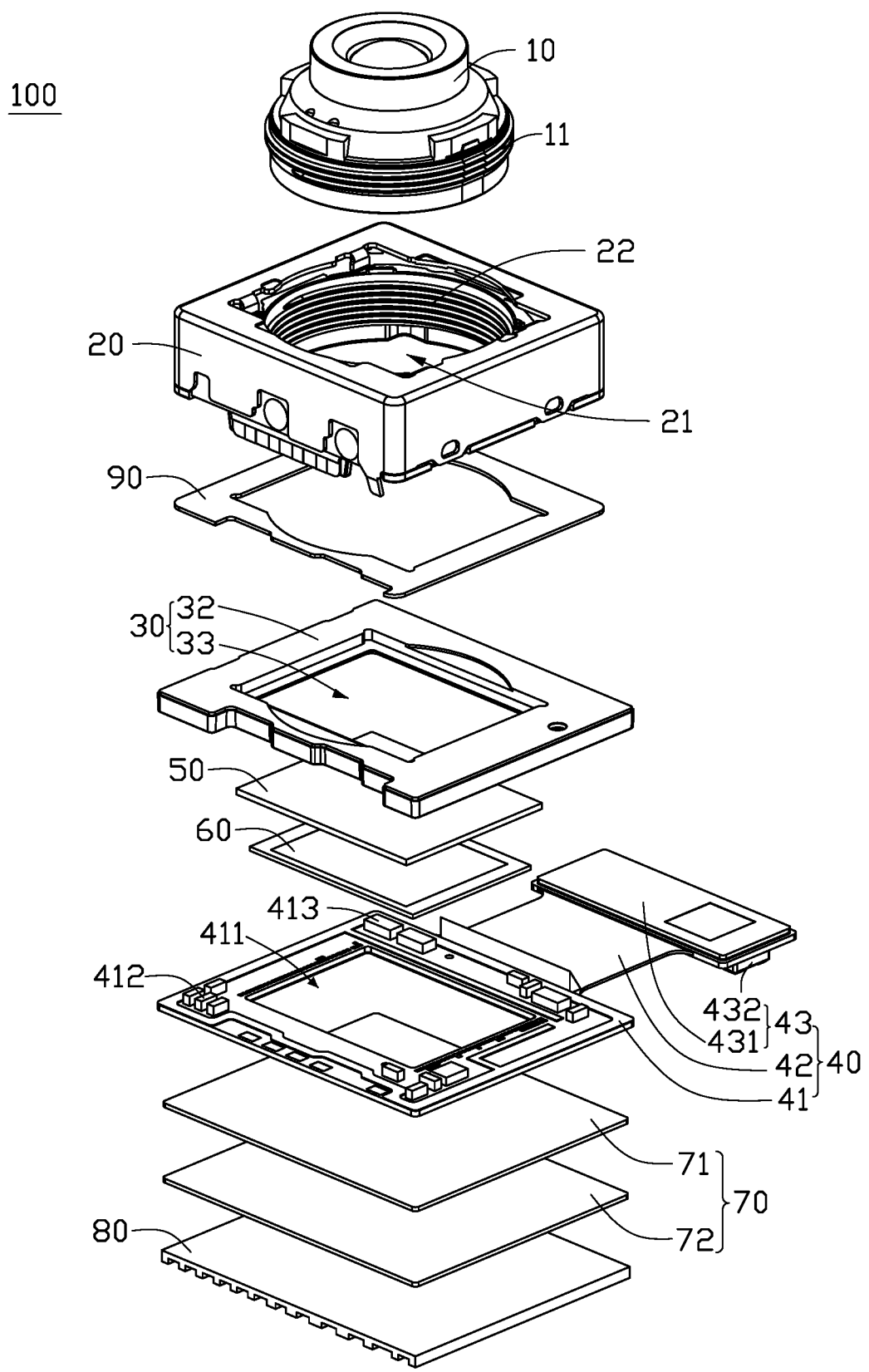
FIG. 2 is an exploded view of the camera module of FIG. 1.
Figure 3:
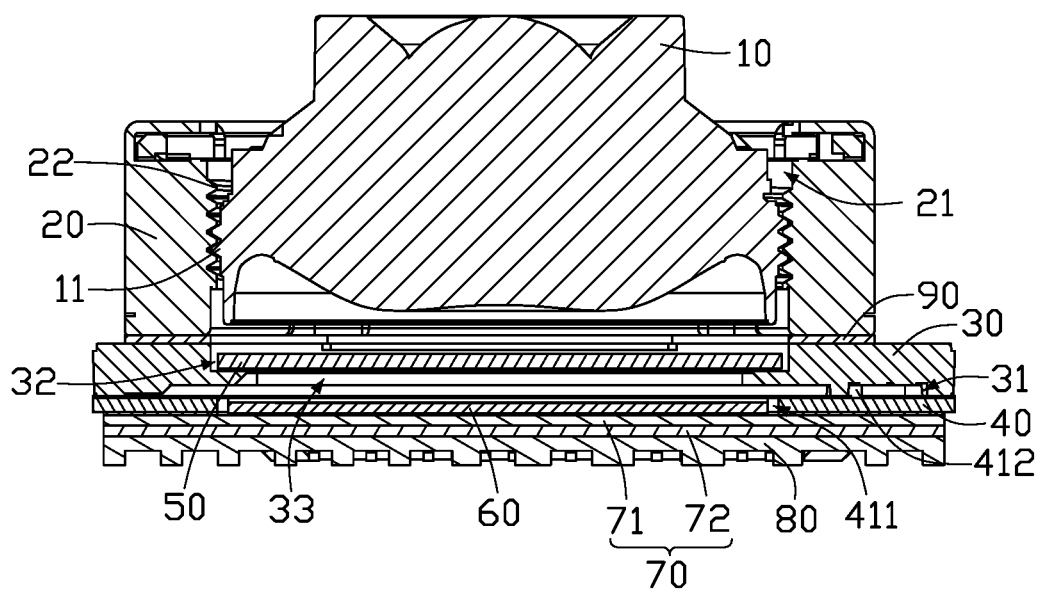
FIG. 3 is a cross-section view along line of FIG. 1.

FIGS. 1-3 show an embodiment of a camera module 100. In at least one embodiment, the camera module 100 is an autofocus camera module. In other embodiments, the camera module 100 may also be a certain focus camera module.

In at least one embodiment, the camera module 100 includes a lens 10, a voice coil motor 20, a holder 30, a printed circuit board 40, at least one temperature monitor 412, an optical filter 50, a sensor 60, a refrigeration chip 70, and a cooling fin 80.

The lens 10 is received in the voice coil motor 20. The voice coil motor 20 is mounted on the holder 30. The holder 30 is fixed on the printed circuit board 40. The at least one temperature monitor 412 is formed on the printed circuit board 40 and received in the holder 30. The optical filter 50 is received and fixed in the holder 30. The sensor 60 is received in the holder 30 and electrically connected to the printed circuit board 40. The sensor 60 contacts with the refrigeration chip 70 through the printed circuit board 40. The refrigeration chip 70 is fixed on the printed circuit board 40 and opposite to the holder 30. The cooling fin 80 is fixed on the refrigeration chip 70 and opposite to the printed circuit board 40.

A plurality of external threads 11 is defined on an external wall of the lens 10.

The voice coil motor 20 is fixed on the holder 30 and electrically connected to the printed circuit board 40. In at least one embodiment, the voice coil motor 20 is fixed on the holder 30 by an adhesive layer 90. In at least one embodiment, the adhesive layer 90 is a thermally conductive adhesive with good heat dissipation performance.

A lens receiving groove 21 is defined in the voice coil motor 20. The lens 10 is received in the lens receiving groove 21. A plurality of internal threads 22 is defined on an internal wall of the lens receiving groove 21. The plurality of internal threads 22 matches with the plurality of external threads 11 to fix the lens 10 in the lens receiving groove 21. The voice coil motor 20 drives the lens 10 to move up and down in the lens receiving groove 21 to achieve focusing to make an image clearer.

The holder 30 supports the voice coil motor 20, and carries the optical filter 50.

The holder 30 has a substantially square shape.

The holder 30 is fixed on the printed circuit board 40 by another adhesive layer 90.

A second receiving groove 31, a third receiving groove 32, and a through hole 33 are defined in the holder 30. The second receiving groove 31 is connected to the third receiving groove 32 by the through hole 33. The second receiving groove 31 abuts the lens 10. The second receiving groove 31 has a size that is greater than that of the through hole 33. The third receiving groove 32 is used to receive the optical filter 50. The second receiving groove 31 is used to receive the at least one temperature monitor 412 and the sensor 60. The through hole 33 faces the lens 10.

The printed circuit board 40 may be a ceramic substrate, a flexible printed circuit board, a rigid printed circuit board, a rigid-flex printed circuit board, or the like. In at least one embodiment, the printed circuit board 40 is a rigid-flex printed circuit board.

The printed circuit board 40 includes a first rigid portion 41, a second rigid portion 43, and a flexible portion 42. The flexible portion 42 is located between the first rigid portion 41 and the second rigid portion 43.

A first receiving groove 411 is defined in the printed circuit board 40. The first receiving groove 411 penetrates through the printed circuit board 40. The sensor 60 is received in the first receiving groove 411. In at least one embodiment, the first receiving groove 411 is located in the first rigid portion 41.

The at least one temperature monitor 412 is fixed on the printed circuit board 40 and electrically connected to the printed circuit board 40. The at least one temperature monitor 412 is arranged on one side of the first receiving groove 411. In at least one embodiment, the at least one temperature monitor 412 is located in the first rigid portion 41. The at least one temperature monitor 412 is used to monitor an internal temperature of the camera module 100, provide the internal temperature to a user in real time, and control the refrigeration chip 70 to work when the internal temperature exceeds a working bearing temperature of the camera module 100. The refrigeration chip 70 is used to dissipate heat.

The at least one temperature monitor 412 is mounted on the printed circuit board 40 by a surface mounting technology (SMT) process.

In at least one embodiment, the at least one temperature monitor 412 is a temperature sensor or a negative temperature coefficient (NTC) thermistor. In at least one embodiment, the at least one temperature monitor 412 is an NTC thermistor.

The NTC thermistor generally refers to semiconductor materials or components with large coefficients. A resistance value of the NTC thermistor is in a range from $10\Omega$ to $10^6\Omega$. A temperature coefficient of the NTC thermistor is in a range from $-2\%$ to $6.5\%$. The NTC thermistor can be widely used for temperature measurement, temperature control, temperature compensation, and so on. The resistance value of the NTC thermistor decreases rapidly with temperature rise under a certain measurement power. Utilizing this characteristic, the NTC thermistor can determine a corresponding temperature by measuring its resistance value, thereby detecting and monitoring a temperature. As the camera module 100 works for a long time, the internal temperature of the camera module 100 becomes higher and higher. The NTC thermistor can monitor the internal temperature of the camera module 100.

A plurality of electronic components 413 is mounted on the printed circuit board 40 and electrically connected to the printed circuit board 40. The plurality of electronic components 413 is located around the first receiving groove 411. In at least one embodiment, the plurality of electronic components 413 is mounted on the first rigid portion 41. The plurality of electronic components 413 can be components such as a resistor, a capacitor, a diode, a transistor, a relay, or an electrically erasable programmable read only memory (EEPROM).

A stiffening plate 431 and an electrical connection portion 432 are mounted on the printed circuit board 40. In at least one embodiment, the stiffening plate 431 and the electrical connection portion 432 are mounted on two opposite surfaces of the second rigid portion 43. The stiffening plate 431 is used to enhance strength of the second rigid portion 43. The electrical connection portion 432 is used to connect external electronic components (not shown). The electrical connection portion 432 may be a connector or an edge connector (gold fingers). The electrical connection portion 432 is used to implement signal transmission between the camera module 100 and the external electronic components. The plurality of electronic components 413 and the electrical connection portion 432 can be located on two different surfaces of the printed circuit board 40 or on a same surface of the printed circuit board 40. In at least one embodiment, the plurality of electronic components 413 and the electrical connection portion 432 are located on two different surfaces of the printed circuit board 40.

The optical filter 50 prevents stray light from entering into the camera module 100 and, only allows light with a specific wavelength to pass through, so as to reduce the influence of stray light on the image quality. The optical filter 50 is received and fixed in the third receiving groove 32.

The sensor 60 is received in the first receiving groove 411 and electrically connected to the printed circuit board 40. The sensor 60 faces the optical filter 50 and is formed on the refrigeration chip 70.

The refrigeration chip 70 is formed on the printed circuit board 40 and opposite to the holder 30.

In at least one embodiment, the refrigeration chip 70 is a semiconductor refrigeration chip. The refrigeration chip 70 includes a cold surface 71 and a hot surface 72 opposite to the cold surface 71. The sensor 60 is formed on the cold surface 71. The cold surface 71 is configured to absorb heat from the sensor 60. When the refrigeration chip 70 is powered on, the cold surface 71 absorb heat, and the hot surface 72 generates heat. The cold surface 71 of the refrigeration chip 70 can quickly absorb the heat generated by the sensor 60, so that the inner temperature of the camera module 100 can be quickly reduced.

In one implementation, the refrigeration chip 70 operates to weld an N-type semiconductor particle and a P-type semiconductor particle with a metal piece to form a pair of thermocouples. When a direct current flows from the N-type semiconductor particle (electronic type) to the P-type semiconductor particle (cavity type), an endothermic phenomenon occurs at cold ends of the N-type semiconductor particle and the P-type semiconductor particle, and hot ends of the N-type semiconductor particle and the P-type semiconductor particle generate heat. Because one pair of thermocouples has a small thermal effect, so dozens or hundreds of pairs of thermocouples are paired into a thermopile, which is called a thermoelectric component. That is to say, the refrigeration chip 70 may also be referred to as a thermoelectric module. A plurality of the cold ends constitutes the cold surface 71, and a plurality of the hot ends constitutes the hot surface 72.

The cooling fin 80 is fixed on the hot surface 72. The cooling fin 80 is used to prevent the heat generated by the refrigeration chip 70 from diffusing into the camera module 100, thereby preventing the internal temperature of the camera module 100 from rising, further improving the image quality of the camera module 100.

Figure 4:
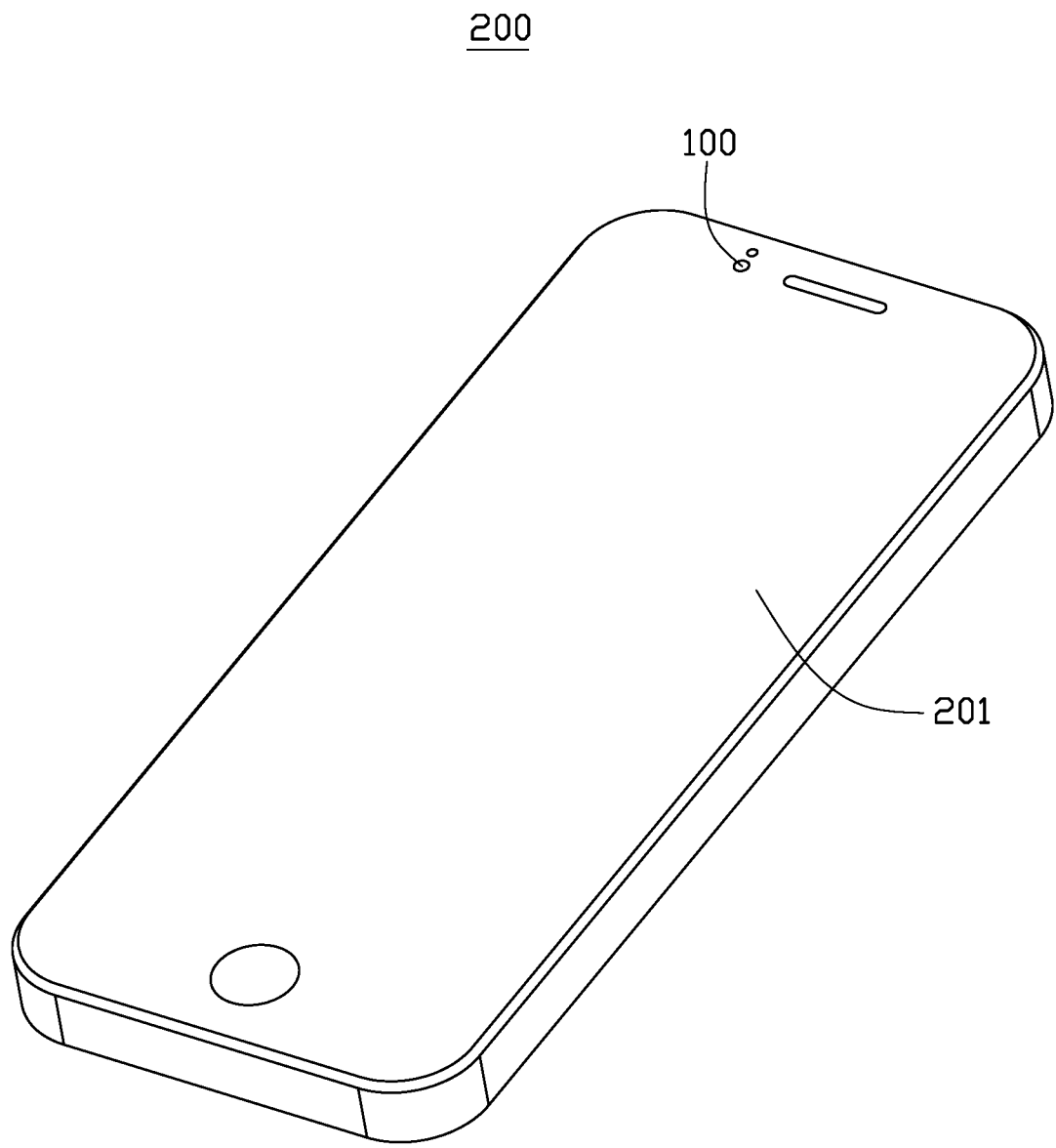
FIG. 4 is a perspective view of an electronic device.

FIG. 4 shows an embodiment of an electronic device 200. The electronic device 200 includes a body 201. The camera module 100 is mounted in the body 201. The electronic device 200 may be a smart phone, a tablet computer, or the like. In at least one embodiment, the electronic device 200 is a smart phone.

With the embodiments described above, the refrigeration chip 70 is formed on the printed circuit board 40, and the sensor 60 is formed on the cold surface 71 of the refrigeration chip 70, so that, heat in the camera module 100 can be absorbed, thereby the internal temperature of the camera module 100 can be reduced. Further, the at least one temperature monitor 412 is formed on the printed circuit board 40 to monitor the internal temperature of the camera module 100, provide the internal temperature to a user in real time, and control the refrigeration chip 70 to work, when the internal temperature exceeds a working bearing temperature of the camera module 100, thereby the at least one temperature monitor 412 can make the internal temperature of the camera module 100 to be controlled. Furthermore, the cooling fin 80 formed on the hot surface 72 of the refrigeration chip 70 can prevent the heat generated by the refrigeration chip 70 from diffusing into the camera module 100, thereby preventing the internal temperature of the camera module 100 from rising, further improving the image quality of the camera module 100.

The embodiments shown and described above are only examples. Many details are often found in the art such as the other features of a camera module and an electronic device using the camera module. Therefore, many such details are neither shown nor described. Even though numerous characteristics and advantages of the present disclosure have been positioned forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. A camera module comprising:
   a printed circuit board; wherein a first receiving groove is defined in the printed circuit board;
   a sensor, wherein the sensor is received in the first receiving groove and electrically connected to the printed circuit board;
   a refrigeration chip, wherein the refrigeration chip is formed on and electrically connected to the printed circuit board; the refrigeration chip comprises a cold surface, the sensor is formed on the cold surface, the cold surface is configured to absorb heat from the sensor when the refrigeration chip is powered on;
   at least one temperature monitor formed on and electrically connected to the printed circuit board; and
   a holder formed on the printed circuit board and a lens formed on the holder, wherein the holder comprises a second receiving groove; the at least one temperature monitor and the sensor are received in the second receiving groove.

2. The camera module of claim 1, wherein the at least one temperature monitor is arranged on one side of the first receiving groove.

3. The camera module of claim 2, wherein the at least one temperature monitor is a temperature sensor or a negative temperature coefficient thermistor.

4. The camera module of claim 1, wherein the refrigeration chip further comprises a hot surface opposite to the cold surface, and the camera module further comprises a cooling fin fixed on the hot surface.

5. The camera module of claim 1, wherein the refrigeration chip is a semiconductor refrigeration chip.

6. The camera module of claim 1, wherein the holder further comprises a third receiving groove; the camera module further comprises an optical filter; the optical filter is received in the third receiving groove; and the optical filter faces the lens.

7. The camera module of claim 6, wherein the third receiving groove is connected to the second receiving groove by a through hole; the sensor faces the through hole; and the through hole faces the lens.

8. The camera module of claim 1, further comprising a voice coil motor formed on the holder and electrically connected to the printed circuit board, wherein a lens receiving groove is defined in the voice coil motor; the lens is received in the lens receiving groove; a plurality of internal threads is defined on an internal wall of the lens receiving groove; a plurality of external threads is defined on an external wall of the lens; and the plurality of internal threads matches with the plurality of external threads to fix the lens in the lens receiving groove.

9. An electronic device, comprising:
   a body;
   a camera module mounted in the body comprising:
      a printed circuit board; wherein a first receiving groove is defined in the printed circuit board;
      a sensor, wherein the sensor is received in the first receiving groove and electrically connected to the printed circuit board;
      a refrigeration chip, wherein the refrigeration chip is formed on and electrically connected to the printed circuit board; the refrigeration chip comprises a cold surface, the sensor is formed on the cold surface, the cold surface is configured to absorb heat from the sensor when the refrigeration chip is powered on;
      at least one temperature monitor formed on and electrically connected to the printed circuit board; and
      a holder formed on the printed circuit board and a lens formed on the holder, wherein the holder comprises a second receiving groove; the at least one temperature monitor and the sensor are received in the second receiving groove.

10. The electronic device of claim 9, wherein the at least one temperature monitor is arranged on one side of the first receiving groove.

11. The electronic device of claim 10, wherein the at least one temperature monitor is a temperature sensor or a negative temperature coefficient thermistor.

12. The electronic device of claim 9, wherein the refrigeration chip further comprises a hot surface opposite to the cold surface, and the camera module further comprises a cooling fin fixed on the hot surface.

13. The electronic device of claim 9, wherein the refrigeration chip is a semiconductor refrigeration chip.

14. The electronic device of claim 9, wherein the holder further comprises a third receiving groove; the camera module further comprises an optical filter; the optical filter is received in the third receiving groove; and the optical filter faces the lens.

15. The electronic device of claim 14, wherein the third receiving groove is connected to the second receiving groove by a through hole; the sensor faces the through hole; and the through hole faces the lens.

16. The electronic device of claim 9, further comprising a voice coil motor formed on the holder and electrically connected to the printed circuit board, wherein a lens receiving groove is defined in the voice coil motor; the lens is received in the lens receiving groove; a plurality of internal threads is defined on an internal wall of the lens receiving groove; a plurality of external threads is defined on an external wall of the lens; and the plurality of internal threads matches with the plurality of external threads to fix the lens in the lens receiving groove.

* * * * *